US008575946B2

(12) United States Patent
Kato et al.

(10) Patent No.: US 8,575,946 B2
(45) Date of Patent: Nov. 5, 2013

(54) CONTAINER POSITION MEASURING METHOD AND CONTAINER POSITION MEASURING APPARATUS

(75) Inventors: Tadashi Kato, Tokyo (JP); Shoichi Kato, Tokyo (JP)

(73) Assignee: Nihon Engineering Co., Ltd., Tokyo (JP)

( * ) Notice: Subject to any disclaimer, the term of this patent is extended or adjusted under 35 U.S.C. 154(b) by 275 days.

(21) Appl. No.: 13/124,880

(22) PCT Filed: Jul. 13, 2009

(86) PCT No.: PCT/JP2009/003263
§ 371 (c)(1),
(2), (4) Date: Apr. 20, 2011

(87) PCT Pub. No.: WO2010/047017
PCT Pub. Date: Apr. 29, 2010

(65) Prior Publication Data
US 2011/0199099 A1 Aug. 18, 2011

(30) Foreign Application Priority Data
Oct. 20, 2008 (JP) ................................ 2008-270150

(51) Int. Cl.
*G01R 27/04* (2006.01)

(52) U.S. Cl.
USPC .......................................................... 324/642

(58) Field of Classification Search
None
See application file for complete search history.

(56) References Cited

U.S. PATENT DOCUMENTS 6,648,156 B1 * 11/2003 Bryfors et al. ................ 212/270
2011/0199099 A1 * 8/2011 Kato et al. .................... 324/642

FOREIGN PATENT DOCUMENTS

EP 1 087 237 3/2001
JP 63-34582 3/1988
JP 07-306032 11/1995
JP 11-228073 8/1999
JP 2002-527317 8/2002
JP 2005-104665 4/2005
JP 2006-312521 11/2006

OTHER PUBLICATIONS

International Search Report for International Application No. PCT/JP2009/003263 dated Oct. 6, 2009.

* cited by examiner

*Primary Examiner* — Melissa Koval
*Assistant Examiner* — Trung Nguyen
(74) *Attorney, Agent, or Firm* — Kratz, Quintos & Hanson, LLP

(57) ABSTRACT

A container position measuring method using a microwave sensor 31 which emits microwave 35 and receives reflected wave of the microwave 35, wherein a position of a corner portion of a transportation container is measured by reflected wave from the corner portion. The microwave 35 is not influenced by weather and color of a transportation container 18. Therefore it is possible to reliably measure position data of the transportation container. The microwave 35 does not easily receive the influence of weather and color of the transportation container. The present invention provides a position measuring method capable of stably measure position data of the transportation container.

7 Claims, 5 Drawing Sheets

| | |
|---|---|
| 1 | Container crane |
| 11 | Body mount |
| 17 | Hoisting attachment-laterally moving means |
| 18 | Container |
| 19 | Hoisting attachment |
| 31 | Microwave sensor A |
| 32 | Microwave sensor B |
| 33 | Microwave sensor C |
| 34 | Microwave sensor D |
| 35 | Microwave |

| | |
|---|---|
| 1 | Container crane |
| 11 | Body mount |
| 17 | Hoisting attachment-laterally moving means |
| 18 | Container |
| 19 | Hoisting attachment |
| 31 | Microwave sensor A |
| 32 | Microwave sensor B |
| 33 | Microwave sensor C |
| 34 | Microwave sensor D |
| 35 | Microwave |

CONTAINER POSITION MEASURING METHOD AND CONTAINER POSITION MEASURING APPARATUS

TECHNICAL FIELD

The present invention relates to a container position measuring method and a container position measuring apparatus for measuring a position of a transportation container which is transported by a ship, a vehicle and the like and which is unloaded by a container yard, i.e., for measuring a position of a transportation container in a state where it is stacked on the ground.

BACKGROUND TECHNIQUE

Generally, a transportation container is handled by a special crane. The transportation container is handled in such a manner that a hoisting attachment-laterally moving means in which a hoisting attachment is disposed laterally moves on a body mount, the hoisting attachment is vertically moved by the hoisting attachment-laterally moving means. At that time, to avoid collision between a transportation container which is stacked below the crane and a transportation container which is handled by the hoisting attachment, there is disclosed a technique for measuring a position of the transportation container stacked below the crane (see patent document 1 for example).

The conventional technique for measuring a container position will be described below with reference to a drawing.

FIG. 7 is a diagram showing an entire yard crane having a container collision-preventing apparatus. In FIG. 7, a crane 105 which handles a container 101 includes a laterally moving body 111 which vertically moves a hoisting attachment 110. There is disclosed a method in which a two-dimensional laser sensor 113 having a fan-shaped detection range in a laterally moving direction is mounted on the laterally moving body 111 at its location where a lower edge of the container 101 suspended by the hoisting attachment 110 can be seen, the laterally moving direction is scanned by the two-dimensional laser sensor 113, and position data of the lower edge of the container 101 and a corner portion of a ceiling surface of a container 102 which is to be stacked is measured by the two-dimensional laser sensor 113.

[Patent Document 1] Japanese Patent Application Laid-open No. 2005-104665

DISCLOSURE OF THE INVENTION

The conventional technique uses the two-dimensional laser sensor as a distance measuring sensor, but this technique has the following problems. That is, a measuring medium of the two-dimensional laser sensor is light, light passes through a space at the time of a measuring operation, but light is easily influenced by a state of atmosphere (rain and fog) at that time and as a result, the measuring operation can not be carried out in some cases. Usually, a transportation container is handled outdoor, and especially when weather condition is bad, operation error is prone to be generated due to a poor-visual condition. Therefore, the handling operation largely depends on a distance measuring sensor in many cases. Under such a condition, if the measuring operation can not be carried out, the probability of collision accident is increased.

Since the two-dimensional laser sensor is light, if color of a target object is black or dark color, light is absorbed and is not reflected, and it becomes difficult to measure. Since color of a transportation container is not especially specified, there is a black or dark color transportation container. In such a case, the target transportation container can not be detected and as a result, there is a problem that the collision accident can not be avoided. Especially when color of the target object is black, the target object can not be detected at all.

Further, according to the conventional technique, it is necessary to scan a medium and thus, the two-dimensional laser sensor is provided with a movable portion, but it is necessary to always keep swinging for scanning during a sensing operation. Since the movable portion is provided, the apparatus becomes complicated and expensive. Further, the movable portion is worn and adhered, and mechanical lifetime is shortened. Sensed data is synthesized and a position of an edge of a ceiling surface of a target container is estimated. Therefore, enormous amounts of complicated data processing is required. Therefore, the apparatus becomes expensive by any means.

The inventors focused attention on the conventional problem, and it is an object of the present invention to provide a position measuring method capable of stably measuring position data of a transportation container which is less prone to be influenced by weather and color of the transportation container, and to provide an inexpensive and reliable position measuring apparatus.

Means for Solving the Problem

A first aspect of the present invention provides a container position measuring method using a microwave sensor which emits microwave and receives reflected wave of the microwave, wherein a position of a corner portion of a transportation container is measured by reflected wave from the corner portion.

According to a second aspect of the invention, in the container position measuring method of the first aspect, the microwave passes through the corner portion by moving the microwave sensor in a constant direction.

According to a third aspect of the invention, in the container position measuring method of the first aspect, when a range in which a gain becomes 50% with respect to a center of the emitted microwave is defined as a directivity angle P of an antenna of the microwave sensor, an offset angle Q between a flat surface of the transportation container and microwave of the microwave sensor is in a range of $1.5\times P<Q<90-(1.5\times P)$.

A fourth aspect of the invention provides a container position measuring method in which a microwave sensor which emits microwave and receives reflected wave of the microwave is used, the microwave is emitted such that the microwave is offset by a predetermined angle from a direction perpendicular to a flat surface of a transportation container, and a position of the flat surface of the transportation container is measured by reflected wave from the flat surface, wherein when a range in which a gain becomes 50% with respect to a center of the emitted microwave is defined as a directivity angle P of an antenna of the microwave sensor, the offset angle R is in a range of $1<R<1.5\times P$.

A fifth aspect of the invention provides a container position measuring apparatus which carries out the container position measuring method according to the first aspect, comprising a body mount of a container crane disposed above the transportation container which is stacked, and a hoisting attachment-laterally moving means which is laterally movably supported on the body mount and which vertically moves a hoisting attachment, wherein an emitting direction of the microwave is offset downward and by a predetermined angle with respect to a travelling direction of the hoisting attachment-laterally moving means, and the microwave sensor is disposed on the hoisting attachment-laterally moving means.

According to a sixth aspect of the invention, in the container position measuring apparatus of the fifth aspect, when a range in which a gain becomes 50% with respect to a center of the emitted microwave is defined as a directivity angle P of an antenna of the microwave sensor, the offset angle Q is in a range of $1.5\times P<Q<90-(1.5\times P)$.

A seventh aspect of the invention provides a container position measuring apparatus which carries out the container position measuring method according to the fourth aspect, comprising a body mount of a container crane disposed above the transportation container which is stacked, and a hoisting attachment-laterally moving means which is laterally movably supported on the body mount and which vertically moves a hoisting attachment, wherein an emitting direction of the microwave is offset downward and by the angle R with respect to a travelling direction of the hoisting attachment-laterally moving means, and the microwave sensor is disposed on the hoisting attachment-laterally moving means.

According to an eighth aspect of the invention, in the container position measuring apparatus of the fifth or seventh aspect, the apparatus further includes at least one more microwave sensor, wherein the plurality of microwave sensors are used, one of the microwave sensors is disposed in one of travelling directions of the hoisting attachment-laterally moving means, and the other microwave sensor is disposed in the other travelling direction of the hoisting attachment-laterally moving means.

The container position measuring method of the present invention is less prone to be influenced by weather and color of a transportation container, and it is possible to reliably measure position data of the transportation container.

BEST MODE FOR CARRYING OUT THE INVENTION

Figures 1, 2:
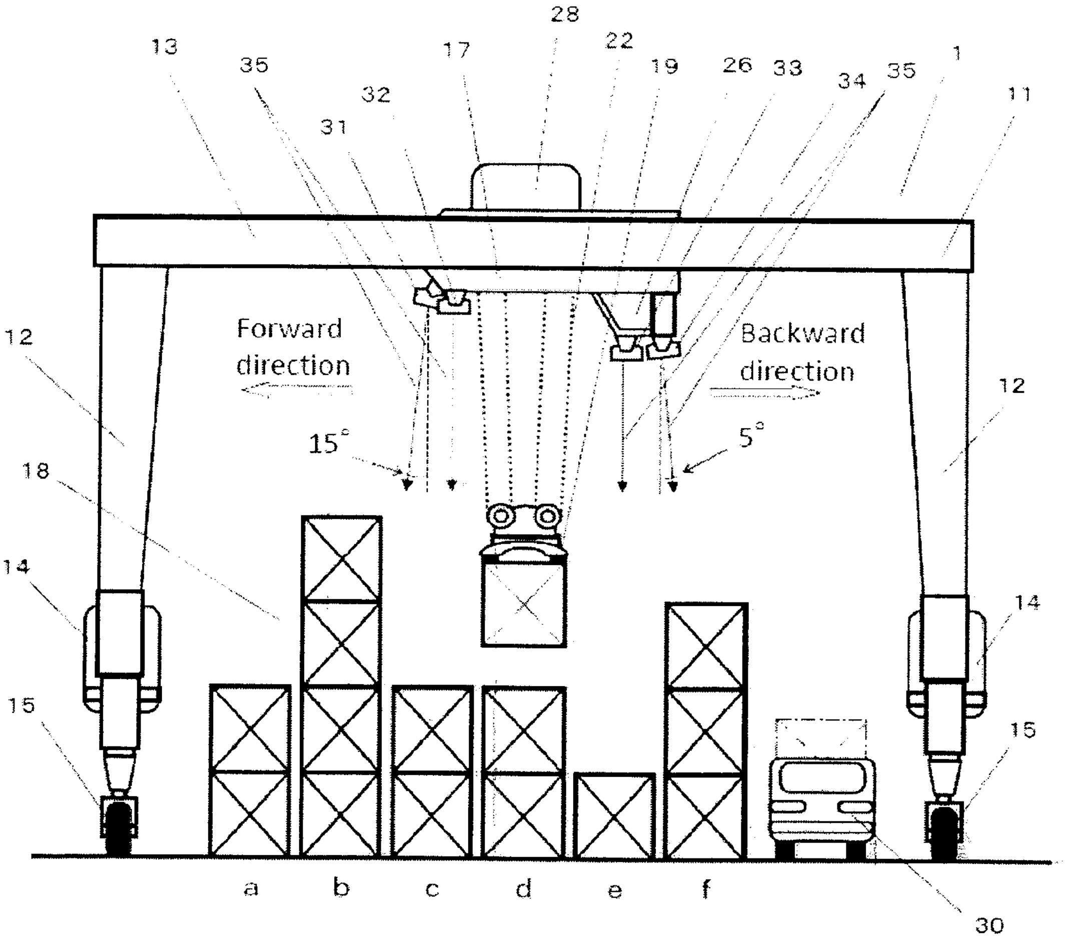
FIG. 1 is a diagram showing an entire crane to which a position measuring method of a container and a position measuring apparatus of the container according to an embodiment of the present invention are applied.
FIG. 2 is a diagram showing a structure of a microwave sensor of the embodiment.

A container position measuring method according to a first aspect of the present invention measures a position of a corner portion of a transportation container by reflected wave from the corner portion. According to this aspect, the measuring method is less prone to be influenced by weather or color of the container, and it is possible to reliably measure position data of the transportation container.

According to a second aspect of the invention, in the container position measuring method of the first aspect, microwave passes through the corner portion by moving a microwave sensor in a constant direction. According to this aspect, it is unnecessary to scan the microwave and thus, a movable portion is unnecessary, and high reliability can be obtained.

According to a third aspect of the invention, in the container position measuring method of the first aspect, when a range in which a gain becomes 50% with respect to a center of the emitted microwave is defined as a directivity angle P of an antenna of the microwave sensor, an offset angle Q between a flat surface of the transportation container and microwave of the microwave sensor is in a range of $1.5\times P<Q<90-(1.5\times P)$. According to this aspect, microwave can hit the corner portion more reliably.

According to the container position measuring method of the fourth aspect of the invention, when a range in which a gain becomes 50% with respect to a center of the emitted microwave is defined as a directivity angle P of an antenna of the microwave sensor, the offset angle R is in a range of $1<R<1.5\times P$. According to this aspect, when a position of a flat surface of a container is measured, flexibility of a mounting position of the microwave sensor is enhanced.

The fifth aspect of the invention provides the container position measuring apparatus which carries out the container position measuring method of the first aspect, the container position measuring apparatus includes a body mount of a container crane disposed above the transportation container which is stacked, and a hoisting attachment-laterally moving means which is laterally movably supported on the body mount and which vertically moves a hoisting attachment. An emitting direction of the microwave is offset downward and by a predetermined angle with respect to a travelling direction of the hoisting attachment-laterally moving means, and the microwave sensor is disposed on the hoisting attachment-laterally moving means. According to this aspect, since a position of the corner portion of the container can be measured by the microwave sensor, the microwave sensor does not easily receive influence of weather and color of the container, and it is possible to inexpensively provide a reliable position measuring apparatus capable of stably measuring position data.

According to the sixth embodiment of the invention, in the container position measuring apparatus of the fifth embodiment, when a range in which a gain becomes 50% with respect to a center of the emitted microwave is defined as a directivity angle P of an antenna of the microwave sensor, the offset angle Q is in a range of $1.5\times P<Q<90-(1.5\times P)$. According to this aspect, it is possible to more reliably measure the corner portion.

The seventh aspect of the invention provides the container position measuring apparatus which carries out the container position measuring method of the fourth aspect, the container position measuring apparatus includes a body mount of a container crane disposed above the transportation container which is stacked, and a hoisting attachment-laterally moving means which is laterally movably supported on the body mount and which vertically moves a hoisting attachment. An emitting direction of the microwave is offset downward and by the angle R with respect to a travelling direction of the hoisting attachment-laterally moving means, and the microwave sensor is disposed on the hoisting attachment-laterally moving means. According to this aspect, since a position of the corner portion of the container can be measured by the microwave sensor, the microwave sensor does not easily receive influence of weather and color of the container, and it is possible to stably measure position data of a ceiling surface of the transportation container, and flexibility of a mounting position of the microwave sensor is enhanced.

According to the eighth aspect of the invention, in the container position measuring apparatus of the fifth or seventh aspect, the container position measuring apparatus further includes at least one more microwave sensor, the plurality of microwave sensors are used, one of the microwave sensors is disposed in one of travelling directions of the hoisting attachment-laterally moving means, and the other microwave sensor is disposed in the other travelling direction of the hoisting attachment-laterally moving means. According to this aspect, it is possible to grasp positions of containers which are adjacent to both sides of a subject transportation container which is loaded by the hoisting attachment-laterally moving means.

Embodiment

An embodiment of the present invention will be described in detail based on the drawings.

Figure 3:
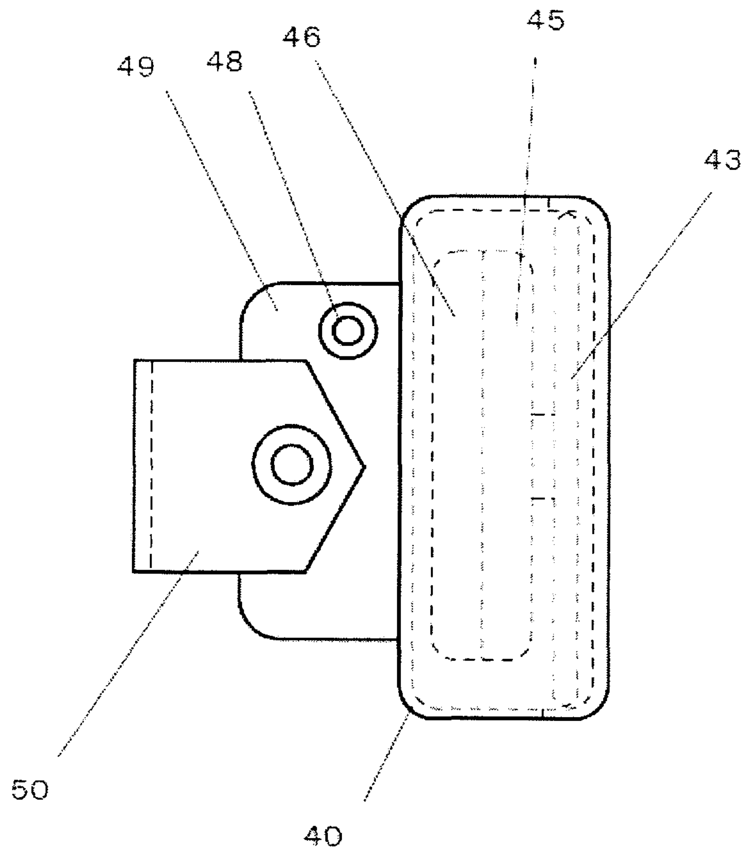
FIG. 3 is a block diagram of the microwave sensor of the embodiment.
Figure 4:
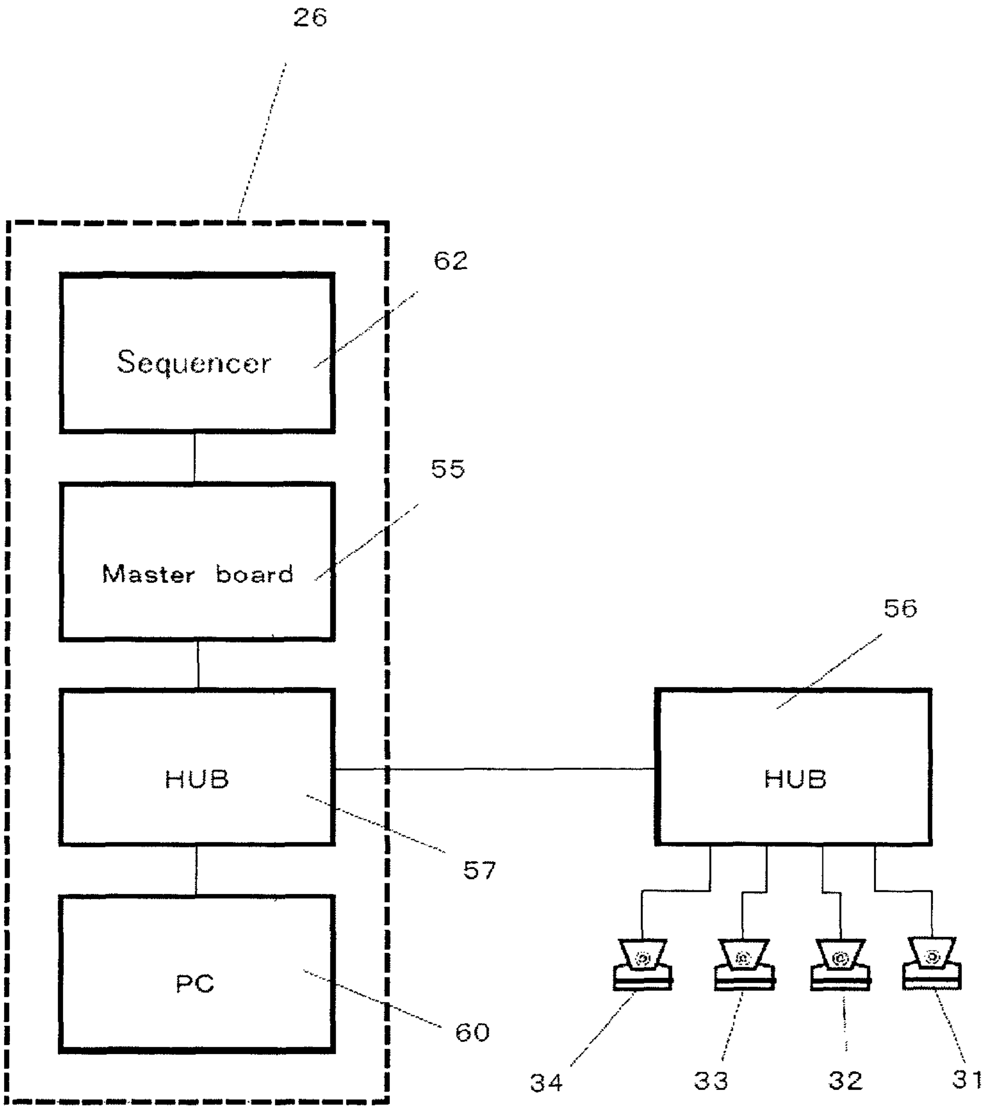
FIG. 4 is a diagram showing a relation between microwave and data of the embodiment.
Figure 5:
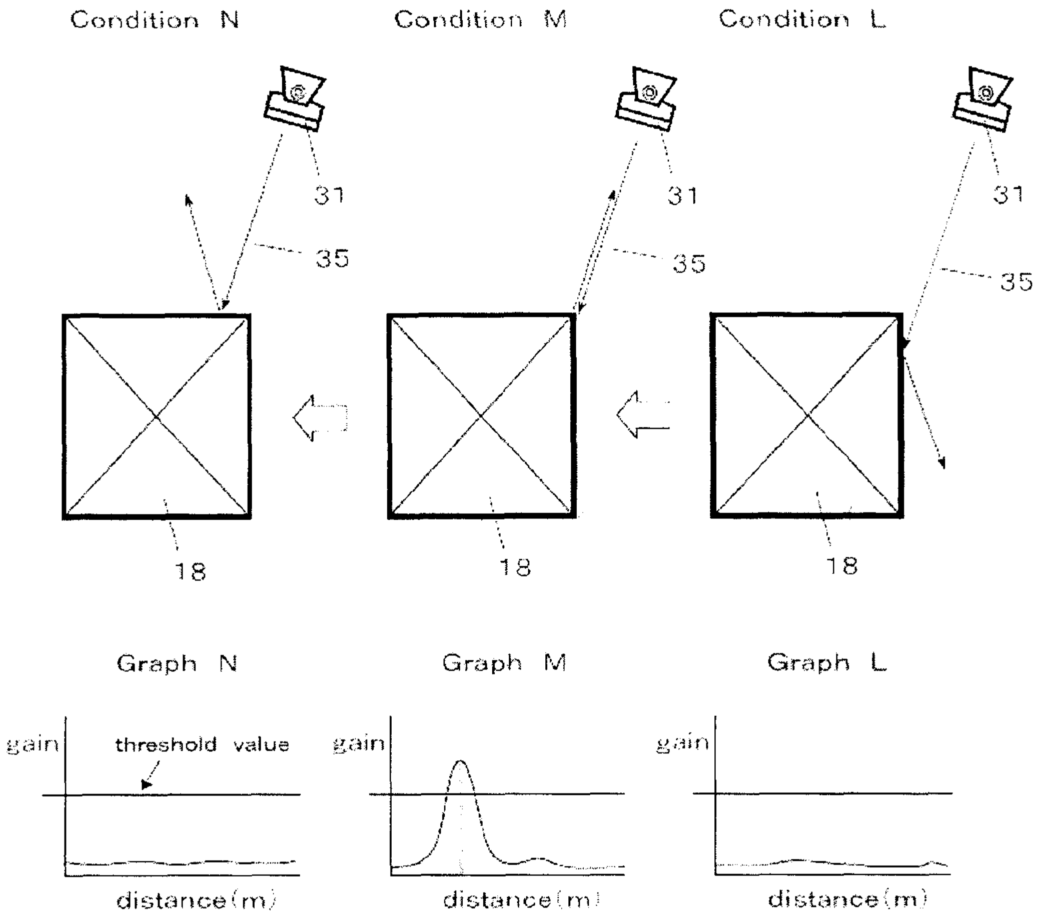
FIG. 5 is a characteristic diagram of distance data of the embodiment.
Figure 6:
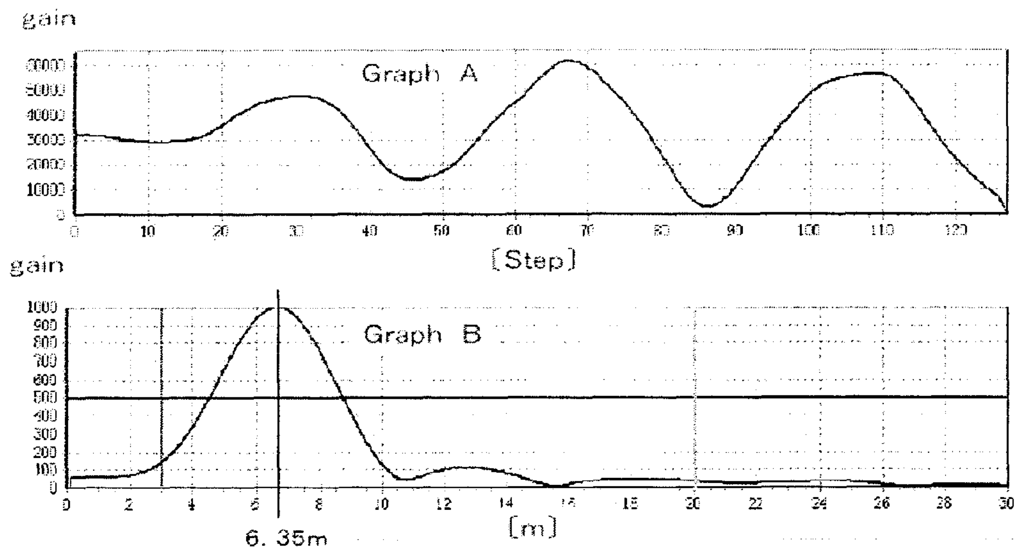
FIG. 6 is an explanatory diagram showing an offset angle of microwave of the embodiment.
Figure 7:
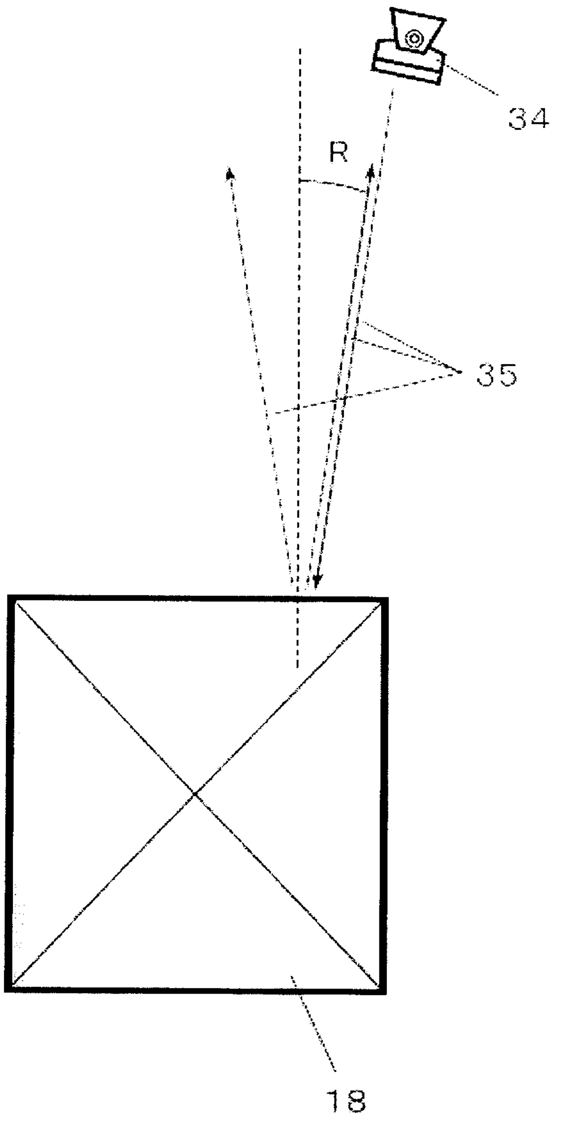
FIG. 7 is a diagram showing an entire yard crane having a conventional container collision-preventing apparatus.

FIG. 1 is a diagram showing an entire crane to which a position measuring method of a container and a position measuring apparatus of the container according to an embodiment of the present invention are applied. FIG. 2 is a diagram showing a structure of a microwave sensor of the embodiment. FIG. 3 is a block diagram of the microwave sensor of the embodiment. FIG. 4 is a diagram showing a relation between microwave and data of the embodiment. FIG. 5 is a characteristic diagram of distance data of the embodiment. FIG. 6 is an explanatory diagram showing an offset angle of microwave of the embodiment First, a structure of a container crane to which the present invention is applied will be described. As shown in FIG. 1, the container crane 1 is a tire-mount type crane. The body mount 11 is a gantry shaped mount, and includes both legs 12 and a garter portion 13 extending between upper portions of the legs 12.

A plurality of running wheels 15 which are respectively rotated by running motors 14 are mounted on lower portions of the legs 12.

A hoisting attachment-laterally moving means 17 is supported by the garter portion 13 such that the hoisting attachment-laterally moving means 17 can move along a longitudinal direction of the garter portion 13 (laterally moving direction, hereinafter), and the hoisting attachment-laterally moving means 17 laterally moves on the garter portion 13 by a laterally moving motor (not shown).

A hoisting attachment 19 can hold a transportation container 18. The hoisting attachment 19 is suspended from the hoisting attachment-laterally moving means 17 by wire ropes 22, and the hoisting attachment 19 can vertically move by hoisting attachment vertically moving means 28. The hoisting attachment vertically moving means 28 includes a take-up motor and a rotation drum (both not shown) provided on the hoisting attachment-laterally moving means 17.

An encoder (not shown) is provided on a rotation shaft of the rotation drum (not shown) so that it is possible to capture a position of the hoisting attachment 19 in its height direction.

A driving room 26 is provided below the hoisting attachment-laterally moving means 17, and a driver who operates the container crane 1 can look ahead and down from the driving room 26.

The transportation containers 18 are arranged below the garter portion 13 in the laterally moving direction in six rows in stages (upper limit is four stages). Here, the rows are called row a to row f. The transportation containers 18 are stacked two stages, four stages, two stages, three stages, one stage and three stages from the row a to the row f in this order. A chassis 30 which is a transportation vehicle is disposed beside the row f.

Microwave sensors 31 and 32 capable of measuring a distance by emitting and receiving microwave 35 are disposed on an end of the hoisting attachment-laterally moving means 17 in a forward direction, and microwave sensors 33 and 34 are disposed on an end of the hoisting attachment-laterally moving means 17 in a backward direction.

An emitting direction of microwave of the microwave sensor 31 is offset in the forward direction of the hoisting attachment-laterally moving means 17. An offset angle is set such that a transportation container 18 located two-row ahead in the forward direction from a directly below transportation container 18 of the hoisting attachment 19 and in this embodiment, the offset angle is set to 15°. In FIG. 1, since the hoisting attachment 19 is located above the transportation container 18 in the row d, the offset angle is set such that the microwave sensor 31 can detect the transportation container 18 in the row b.

In this embodiment, since the microwave sensor 31 is offset in the forward direction, when the hoisting attachment 19 holds the transportation container 18 in the row d as shown in the drawing, the microwave sensor 31 can capture a position of a corner portion of a front upper surface of the transportation container 18 stacked up to the upper limit of the row b, and it is possible to stop the hoisting attachment-laterally moving means 17 before it collides against the transportation container 18 in the row b well in advance.

An emitting direction of microwave of the microwave sensor 32 is oriented below in the vertical direction. By orienting the emitting direction of microwave of the microwave sensor 32 below in the vertical direction, when the hoisting attachment 19 holds the transportation container 18 in the row d, the microwave can be emitted to a ceiling of the transportation container 18 stacked in the row c which is located ahead by one from the row d in a direction perpendicular to the ceiling of the transportation container 18.

An emitting direction of microwave of the microwave sensor 33 is oriented below in the vertical direction. By orienting the emitting direction of microwave of the microwave sensor 33 below in the vertical direction, when the hoisting attachment 19 holds the transportation container 18 in the row d, the microwave can be emitted to a ceiling of the transportation container 18 stacked in the row e which is located backward by one from the row d in a direction perpendicular to the ceiling of the transportation container 18.

An emitting direction of microwave of the microwave sensor is offset in the backward direction of the hoisting attachment-laterally moving means 17. An offset angle is set such that a transportation container 18 located two-row ahead in the backward direction from a directly below transportation container 18 of the hoisting attachment 19 and in this embodiment, the offset angle is set to 5°. In FIG. 1, since the hoisting attachment 19 is located above the transportation container 18 in the row d, the offset angle is set such that the microwave sensor 34 can detect the transportation container 18 in the row f.

In this embodiment, since the microwave sensor 34 is offset in the backward direction, when the hoisting attachment 19 holds the transportation container 18 in the row d as shown in the drawing, the microwave sensor 34 can capture a position of a ceiling of the transportation container 18 stacked up to the upper limit of the row f, and it is possible to stop the hoisting attachment-laterally moving means 17 before it collides against the transportation container 18 in the row f well in advance.

Next, concrete structures of the microwave sensors 31, 32, 33 and 34 will be described. These microwave sensors have the same structures.

In FIG. 2, an FM-CW radar module 45 is accommodated in a waterproof case 40. An antenna 43 constituting the FM-CW radar module 45 is a one-antenna type patch array antenna, and the antenna 43 is integrally coupled to the FM-CW radar module 45 and a control module 46.

Normally, a directivity angle of an antenna of a microwave sensor is an angle range where a gain becomes 50% with respect to a center of emitted microwave 35 and in this embodiment, the directivity angle of the antenna 43 is 4° (±2° with respect to the center).

Main specifications are as follows: transmit frequency is 24.08 to 24.25 (GHz), occupied bandwidth is 76 (MHz), transmission output electric power is 9 (mW), modulation scheme is FM modulation CW, and measuring time is 100 (times/second).

Error of distance measuring precision is suppressed to ±30 mm, and its difference can be discriminated with respect to a plurality of height basic sizes.

A terminal case 49 is provided with a waterproof terminal 48 which sends and receives a signal, and which supplies a power source. The terminal case 49 is fixed to the waterproof case 40, and the waterproof case 40 is fixed to a predetermined subject (the hoisting attachment-laterally moving means 17) through a stay 50 fixed such as to grasp the terminal case 49.

As shown in FIG. 3, the microwave sensors 31, 32, 33 and 34 are connected to a master basement 55 provided in the driving room 26 through the hubs 56 and 57 by the waterproof terminal 48 shown in FIG. 2. A personal computer (PC) 60 which sets various control parameter and a crane sequencer 62 are connected to the master basement 55.

In this embodiment, analogue signals which are output from the microwave sensors 31, 32, 33 and 34 are fast Fourier transformed (FFT), a distance to a subject is measured, the crane sequencer 62 grasps a position thereof, displays the position on a display (not shown) disposed in the driving room 26, and when it is determined that there is a danger of collision, this is displayed on the display (not shown), and an alarm buzzer is given.

A principle for measuring a distance to a subject by the FM-CW sensor used as the microwave sensor of the embodiment will be described.

An analogue signal of the microwave 35 which is output from the antenna 43 is reflected by a subject and becomes a receiving signal, and a difference between a sending wave phase and a receiving wave phase is detected (phase detection).

A signal which is output from the antenna 43 has a low frequency, and a signal which is generally called a beat signal is obtained in the following manner.

$$\text{Beat signal } (f)=((4\cdot\Delta f)/(ST\cdot c))\cdot r \text{ (m)}$$

Here, Δf represents a swept-frequency width, ST represents swept-frequency time, c represents speed of light, and r represents a distance to a subject.

From these relations, if the beat signal is frequency-resolved by the fast Fourier transform, a distance to a subject can be measured.

The FM-CW sensor is known as a sensor capable of measuring a distance in the above-described manner. The FM-CW sensor using the microwave of 24 GHz used in the embodiment as the following characteristics:

1) The sensor does not receive influence of a medium of a propagation path;

2) The sensor does not receive influence of environment such as high temperature, high pressure, in vacuum, dense fog and strong wind;

3) The sensor can measure a distance to a target through a non-metal window irrespective of transparency or opacity;

4) A shape of an antenna can be made small;

5) An output beam width can easily be reduced;

6) The sensor is smaller than a conventional (X-band) radar; and

7) Since a technically compatible part is used, individual licenses are unnecessary.

As described above, the characteristics of the FM-CW sensor is suitable for measuring a position of an object outdoor.

On the other hand, an object formed from flat surfaces such as a transportation container is not suitable for measuring a distance by the FM-CW sensor or a radar. If the flat surface of the measurement subject is perpendicular to a direction of emitted microwave, since the reflected wave is reflected in the direction of the FM-CW sensor, it is possible to easily measure the distance. However, if the flat surface is inclined with respect to the direction of the emitted microwave, since the microwave is reflected at the same angle as an incident angle, the microwave does not return to the microwave sensor, and the FM-CW sensor can not capture a position. Therefore, it was conventionally considered impossible to diagonally measure a distance to a transportation container formed into substantially precise cube using the FM-CW sensor.

Hence, the present inventors focused attention on the fact that when a surface of a transportation container was inclined with respect to a direction of microwave, microwave did not return, and slight reflection from a corner portion of the transportation container was captured. First, an experiment was carried out using a normal commercially available FM-CW sensor, but reflection from the corner portion of the transportation container could not be captured.

Next, the inventors increased electric power density by largely increasing directivity characteristic of a radar, a reflection area was reduced, influence of irregular reflection from periphery was reduced, thereby enhancing an erroneous report ratio. Further, a noise level of the radar itself was also suppressed to an extremely small level.

More specifically, directivity characteristic of the radar was reduced to 4° (±2°) by a patch array antenna, a noise level of the radar was noise-improved of 8 integration (10 log 8) using a part of low noise high S/N and using a crane control side sequencer software, and a radar in which NF8 dB, noise electric power was suppressed to −130 dBm/Hz was completed. As a result, the inventors succeeded in capturing slight reflection from the corner portion of the transportation container.

A corner portion of the transportation container 18 was actually measured using the FM-CW sensor having the above-described characteristics. A result of the measurement will be described below.

FIG. 4 shows a relation between the transportation container 18 and the microwave 35 when the hoisting attachment-laterally moving means 17 laterally moved in the forward direction. FIG. 4 shows a state where a reflection state of the microwave 35 from the transportation container 18 is varied as the hoisting attachment-laterally moving means 17 laterally moves from a condition L to conditions M and N. Graphs L, M and N show distance data corresponding to the conditions L, M and N.

In this embodiment, an emission angle of microwave to the transportation container 18 is constant, and the microwave sensor 31 is moved in the constant direction.

In FIG. 4, as the hoisting attachment-laterally moving means 17 laterally moves, microwave 35 emitted from the microwave sensor 31 hits the transportation container 18 in the order of the conditions L, M and N. In the state of the condition L, since the microwave 35 hits a front surface of the transportation container 18 from a diagonally above location, the microwave is reflected in the opposite direction at the same angle as the incident angle, and the microwave does not return to the microwave sensor 31.

Next, if the microwave 35 passes through the corner portion of the transportation container 18 (state of the condition M), weak as the microwave 35 is, the microwave is reflected from the corner portion and returns to the microwave sensor 31. Time during which the microwave 35 keeps returning from the corner portion is as short as 0.7 seconds under the shortest condition, but since the radar of this embodiment emits microwave 35 100 times per a minute and measures a distance, data sufficient for determining the distance can be obtained. That is, it is possible to obtain at least 70 sets of data M in which values of distances are slightly different from one other.

If the microwave passes through the corner portion and is brought into the state of the condition N, since the microwave 35 hits a ceiling surface of the transportation container 18 from a diagonally above location, the microwave is reflected in the opposite direction at the same angle as the incident angle, and the microwave does not return to the microwave sensor 31.

FIG. 5 shows actual data for capturing the corner portion of the transportation container.

In FIG. 5, a graph A shows an analogue signal of the microwave 35 in the state of the condition M in FIG. 4, and a graph B shows a waveform obtained by fast Fourier transforming (FFT) the analogue signal in the FM-CW radar module 45. Conventionally, it was considered impossible to capture distance data of the corner portion of the transportation container 18, but it can be found that the distance data is clearly captured.

Next, a limit value of an offset angle of the microwave sensor 31 was grasped.

In this embodiment, the microwave sensor 31 is offset in the forward direction of the hoisting attachment-laterally moving means 17, and the offset angle is set to 15° so that the hoisting attachment-laterally moving means 17 can stop well in advance when a corner portion of a front upper surface of the transportation container 18 which is located two-row ahead and which is stacked highest in the forward direction is captured and when the hoisting attachment 19 holds the transportation container 18.

However, if this angle is set small and reflected wave from a ceiling surface reversely returns, it becomes difficult to distinguish reflection from the corner portion and reflection from the flat surface from each other.

The measuring test was repeated to find out whether the reflected wave returned from the ceiling surface of the transportation container 18 even when the microwave sensor was offset, and to find out an angle from the ceiling surface of the transportation container 18 in that case. As a result, it was found that if the offset angle was small, reflected wave returned from the ceiling surface of the transportation container 18, and there was a correlation between the limit angle and the directivity angle of the antenna.

This was such a correlation that when a range where a gain was 50% with respect to a center direction was set to a directivity angle P of the antenna 43 of the microwave sensor, a condition value in which reflected wave from a flat surface of the transportation container 18 returned was an offset angle smaller than $1.5\times P$. That is, according to this condition, it is difficult to distinguish reflection from a corner portion and reflection from a flat surface from each other, and it is difficult to measure a distance only by reflection from the corner portion.

Therefore, an offset angle Q at which the microwave sensor 31 can measure a distance by reflection from a corner portion is in a range of $1.5\times P<Q<90-(1.5\times P)$. Since the offset angle which is set in this embodiment is 15° and this falls within the range of the offset angle Q, the microwave sensor 31 can measure a distance by the reflection from the corner portion.

Even if the microwave sensor is offset within the range of $1.5\times P$, since the reflected wave from the flat surface of the transportation container 18 returns, a permissible offset angle R between the ceiling surface and the microwave 35 for measuring a distance to the ceiling surface should be set to $R<1.5\times P$.

According to the microwave sensor 34 of the embodiment, the directivity angle of the antenna 43 is 4 (deg). Therefore, a permissible range of the offset angle is 6° or less, but since the offset angle of 5° which is set in the embodiment is within the range of P, the microwave sensor 34 can measure a distance by reflection from a flat surface.

In the structure as described above, operation and function will be described next using FIG. 1.

First, operation for moving the transportation container 18 of the uppermost stage in the row d to row a in the forward direction of the hoisting attachment-laterally moving means 17 will be described.

A driver moves the hoisting attachment-laterally moving means 17 to a location where the hoisting attachment 19 is located directly above the transportation container 18 in the row d and then, lowers the hoisting attachment 19. The hoisting attachment 19 is lowered by the hoisting attachment vertically moving means 28 through the wire ropes 22, and the transportation container 18 in the row d is grasped.

At this time, an encoder (not shown) is provided on a rotation shaft of a rotation drum (not shown) which constitutes the hoisting attachment vertically moving means 28, and it is possible to capture a position in a height direction of the hoisting attachment 19. Therefore, it is possible to grasp a height of a bottom surface of the grasped transportation container 18.

At the same time, at this stage, when the hoisting attachment 19 holds the transportation container 18 in the row d, the microwave sensor 32 is located at a position corresponding to a ceiling surface of the transportation container 18 in the row c which is stacked beside the former transportation container 18. Therefore, if the microwave sensor 32 measures a distance between the microwave sensor 32 and the ceiling surface of the transportation container 18, it is possible to grasp a position of the ceiling surface of the transportation container 18 of the uppermost stage in the row c.

Next, if the driver checks that the hoisting attachment 19 holds the transportation container 18, the driver moves the hoisting attachment 19 upward to hoist the transportation container 18. The height of the ceiling surface of the transportation container 18 of the uppermost stage in the row c is grasped, and the height of the bottom surface of the hoisting attachment 19 is also grasped. Therefore, the driver, moves the hoisting attachment 19 upward until the bottom surface of the transportation container 18 becomes higher than the ceiling surface of the transportation container 18 and then, moves the hoisting attachment-laterally moving means 17 in the forward direction.

Then, microwave 35 emitted from the microwave sensor 31 moves to a side surface of the transportation container 18 of the uppermost stage of the row b, to the corner portion, and to a ceiling surface in this order. At that time, at the moment this microwave passes through the corner portion, the antenna 43 captures the reflected wave, and it is possible to grasp a distance between the microwave sensor 31 and the corner portion of the transportation container 18 of the uppermost stage in the row b. Since the offset angle of the microwave sensor 31 is fixed to 15°, it is possible to grasp the position of the corner portion of the transportation container 18 of the uppermost stage in the row b by calculating using trigonometric function.

Here, the offset angle of 15° is such an angle that when the hoisting attachment 19 captures the corner portion of the transportation container 18 of the uppermost stage in the row b while holding the transportation container 18 and moving in the forward direction, the hoisting attachment-laterally moving means 17 can stop well in advance before the grasped transportation container 18 collides a transportation container 18 located two-row ahead. Therefore, the driver judges that it is danger from position information, warning or alarm, and it is possible to stop the lateral movement of the hoisting attachment-laterally moving means 17. Alternatively, the driver moves the hoisting attachment 19 upward while decelerating the lateral movement of the hoisting attachment-laterally moving means 17, and transportation container 18 held by the hoisting attachment 19 can be moved onto a further transportation container 18 without colliding against the transportation container 18 of the uppermost stage in the row b.

In this manner, the driver can move the transportation container 18 grasped by the hoisting attachment 19 to a location directly above the row a, lower the transportation container 18 and can safely complete the transfer operation of the transportation container 18 in a short time.

Next, operation for moving the transportation container 18 of the uppermost stage in the row d to the chassis 30 located in the backward direction of the hoisting attachment-laterally moving means 17 will be described.

The driver moves the hoisting attachment-laterally moving means 17 to a location where the hoisting attachment 19 is located directly above the transportation container 18 in the row d and then, lowers the hoisting attachment 19. The hoisting attachment 19 is lowered by the hoisting attachment vertically moving means 28 through the wire ropes 22, and the hoisting attachment 19 grasps the transportation container 18 in the row d.

In this stage, the encoder (not shown) is provided on the rotation shaft of the rotation drum (not shown) which constitutes the hoisting attachment vertically moving means 28, and it is possible to detect a position in a height direction of the hoisting attachment 19. Therefore, it is possible to grasp a height of a bottom surface of the grasped transportation container 18.

At the same time, at this stage, when the hoisting attachment 19 holds the transportation container 18 in the row d, the microwave sensor 33 is located at a position corresponding to a ceiling surface of the transportation container 18 in the row e which is stacked beside the former transportation container 18. Therefore, if a distance between the microwave sensor 33 and the ceiling surface of the transportation container 18 in the row e is measured, it is possible to grasp a position of the ceiling surface of the transportation container 18 of the uppermost stage in the row e.

Further, when the hoisting attachment 19 holds the transportation container 18, the microwave sensor 34 is offset toward a ceiling surface of a transportation container 18 in the row f which is stacked on two ahead row in the backward direction. Therefore, if a distance between the microwave sensor 34 and a ceiling surface of a transportation container 18 in the row f is measured, it is possible to grasp a distance to the ceiling surface of the transportation container 18 of the uppermost stage in the row f.

Since the offset angle of the microwave sensor 34 is fixed to 5°, it is possible to grasp the position of the transportation container 18 of the uppermost stage in the row f by calculating using trigonometric function.

Next, if the driver checks that the hoisting attachment 19 grasps the transportation container 18 of the uppermost stage in the row d, the driver hoists the transportation container 18 by moving the hoisting attachment 19 upward. At that time, the fact that the row e is lower than the row d, and a height of a ceiling surface of a transportation container 18 of the uppermost stage in the row f and a position of the transportation container 18 grasped by the hoisting attachment 19 are grasped. Therefore, if the hoisting attachment-laterally moving means 17 is moved backward while hoisting the hoisting attachment 19, the driver can move the transportation container 18 to a position where the bottom surface of the held transportation container 18 becomes higher than the ceiling surface of the transportation container 18 of the uppermost stage in the row f in the shortest distance.

In this manner, the driver can move the transportation container 18 grasped by the hoisting attachment 19 to a location directly above the chassis 30, lower the transportation container 18 and can more safely complete the transfer operation of the transportation container 18 in a short time.

The above-described embodiment is based on the premise that a driver manually operates based on position information of the transportation container 18 which is stacked. If the above-described position measuring method of the transportation container 18 and position measuring apparatus of the transportation container 18 are used, and if a collision danger region of the transportation container 18 is set from height data of transportation containers 18 in the rows b and c in the forward direction of the hoisting attachment 19 based on measuring data of the microwave sensor 31 and the microwave sensor 32, it is possible to automatically control deceleration when the transportation container 18 enters that region, and to automatically control a moving operation of the transportation container 18 in the shortest distance while avoiding that region.

There is a known method in which distance sensors are provided on the garter portion 13 at positions corresponding to the chassis 30 and to stack transportation containers 18 arranged below the container crane 1, and a distance to a ceiling surface of the container is measured. When the microwave sensor is used as the distance sensor, even when a ceiling surface of a transportation container 18 is slightly deviated from a position directly below the microwave sensor, it is possible to offset the microwave sensor such that the offset angle R falls within the range $1<R<1.5\times P$ according to the position measuring method of the invention, and to measure a distance to the ceiling surface of the transportation container 18. Therefore, it is possible to measure a distance to the ceiling surface of the transportation container 18 even when the ceiling surface of the transportation container 18 is not directly below the microwave sensor under constraints of mounting position of the microwave sensor, and flexibility of the mounting position of the microwave sensor is enhanced.

In the embodiment, the microwave sensor is fixed to the hoisting attachment-laterally moving means 17 in the predetermined orientation, but the orientation of the microwave sensor may be inclined at any angle to scan microwave, and a position of a corner portion of a subject can be measured. In this case also, the effect of this present invention that the microwave sensor does not receive influence of color of the transportation container 18, and influence of weather is extremely small can be obtained. Therefore, it is possible to stably measure a position.

[Industrial Applicability]

As described above, according to the position measuring method of a condition and the position measuring apparatus of the condition of the present invention, the microwave sensor does not receive influence of color of the transportation container, and influence of weather is extremely small. Therefore, it is possible to stably measure position data of the transportation container and thus, the invention can be applied to a gantry crane and a straddle carrier used for loading and unloading a transportation container to a container ship, and the invention can also be applied to a crane used for transfer to a railcar.

What is claimed is:

1. A container position measuring method using a microwave sensor which emits microwave and receives reflected wave of the microwave, wherein a position of a corner portion of a transportation container is measured by reflected wave from the corner portion, wherein when a range in which a gain becomes 50% with respect to a center of the emitted microwave is defined as a directivity angle P of an antenna of the microwave sensor, an offset angle Q between a flat surface of the transportation container and microwave of the microwave sensor is in a range of $1.5 \times P < Q < 90-(1.5 \times P)$.

2. The container position measuring method according to claim 1, wherein the microwave passes through the corner portion by moving the microwave sensor in a constant direction.

3. A container position measuring method in which a microwave sensor which emits microwave and receives reflected wave of the microwave is used, the microwave is emitted such that the microwave is offset by predetermined angle from a direction perpendicular to a flat surface of a transportation container, and a position of the flat surface of the transportation container is measured by reflected wave from the flat surface, wherein when a range in which a gain becomes 50% with respect to a center of the emitted microwave is defined as a directivity angle P of an antenna of the microwave sensor, the offset angle R is in a range of $1 < R < 1.5 \times P$.

4. A container position measuring apparatus which carries out the container position measuring method according to claim 3, comprising a body mount of a container crane disposed above the transportation container which is stacked, and a hoisting attachment-laterally moving means which is laterally movably supported on the body mount and which vertically moves a hoisting attachment, wherein an emitting direction of the microwave is offset downward and by the angle R with respect to a travelling direction of the hoisting attachment-laterally moving means, and the microwave sensor is disposed on the hoisting attachment-laterally moving means.

5. A container position measuring apparatus which carries out the container position measuring method according to claim 1, comprising a body mount of a container crane disposed above the transportation container which is stacked, and a hoisting attachment-laterally moving means which is laterally movably supported on the body mount and which vertically moves a hoisting attachment, wherein an emitting direction of the microwave is offset downward and by a predetermined angle with respect to a travelling direction of the hoisting attachment-laterally moving means, and the microwave sensor is disposed on the hoisting attachment-laterally moving means.

6. The container position measuring apparatus according to claim 5, wherein when a range in which a gain becomes 50% with respect to a center of the emitted microwave is defined as a directivity angle P of an antenna of the microwave sensor, the offset angle Q is in a range of $1.5 \times P < Q < 90-(1.5 \times P)$.

7. The container position measuring apparatus according to claim 5 or 4, further comprising at least one more microwave sensor, wherein the plurality of microwave sensors are used, one of the microwave sensors is disposed in one of travelling directions of the hoisting attachment-laterally moving means, and the other microwave sensor is disposed in the other travelling direction of the hoisting attachment-laterally moving means.

* * * * *